(12) United States Patent
Huang et al.

(10) Patent No.: US 9,117,043 B1
(45) Date of Patent: Aug. 25, 2015

(54) NET SENSITIVITY RANGES FOR DETECTION OF SIMULATION EVENTS

(75) Inventors: Lixin Huang, Sunnyvale, CA (US); Hem C. Neema, Sunnyvale, CA (US); Sonal Santan, San Jose, CA (US)

(73) Assignee: XILINX, INC., San Jose, CA (US)

( * ) Notice: Subject to any disclaimer, the term of this patent is extended or adjusted under 35 U.S.C. 154(b) by 483 days.

(21) Appl. No.: 13/523,799

(22) Filed: Jun. 14, 2012

(51) Int. Cl.
*G06F 17/50* (2006.01)

(52) U.S. Cl.
CPC ........ *G06F 17/5022* (2013.01); *G06F 17/5036* (2013.01); *G06F 17/5045* (2013.01)

(58) Field of Classification Search
CPC .............. G06F 17/5068; G06F 17/505; G06F 17/5072; G06F 17/5077; G06F 17/5036; G06F 17/5022; G06F 17/5045; G06F 17/5031; G06F 12/0246; G06F 17/5081; G06F 8/71; G06F 12/0661; G06F 12/0684; G06F 17/05
USPC ........................................................ 703/1–22
See application file for complete search history.

(56) References Cited

U.S. PATENT DOCUMENTS

| | | | |
|---|---|---|---|
| 5,854,926 A * | 12/1998 | Kingsley et al. | 717/156 |
| 5,901,064 A | 5/1999 | Weber et al. | |
| 6,493,648 B1 | 12/2002 | Anderson | |
| 6,519,755 B1 | 2/2003 | Anderson | |
| 6,574,787 B1 | 6/2003 | Anderson | |
| 6,651,224 B1 | 11/2003 | Sano et al. | |
| 6,934,872 B2 * | 8/2005 | Wong et al. | 713/503 |
| 7,032,198 B2 | 4/2006 | Sano et al. | |
| 7,143,373 B2 | 11/2006 | Moorby | |
| 7,251,800 B2 | 7/2007 | McElvain et al. | |
| 7,269,541 B1 * | 9/2007 | McGaughy et al. | 703/14 |
| 7,458,042 B2 * | 11/2008 | Colle et al. | 716/103 |
| 7,714,610 B2 * | 5/2010 | He | 326/41 |
| 7,739,644 B1 * | 6/2010 | Chong et al. | 716/119 |
| 7,840,930 B2 * | 11/2010 | Furukawa | 716/129 |
| 2004/0243964 A1 * | 12/2004 | McElvain et al. | 716/12 |
| 2007/0106969 A1 * | 5/2007 | Birch et al. | 716/6 |
| 2007/0157135 A1 * | 7/2007 | Yang | 716/4 |
| 2009/0113356 A1 * | 4/2009 | Rewienski et al. | 716/2 |
| 2009/0164184 A1 * | 6/2009 | Vucurevich et al. | 703/6 |
| 2009/0254875 A1 * | 10/2009 | Mehrotra et al. | 716/12 |

(Continued)

FOREIGN PATENT DOCUMENTS

JP            2004192334            7/2004

OTHER PUBLICATIONS

Bakhaya, F., Anderson, D.V., Net-Sensitivity-Based Optimization of Large-Scale Field-Programmable Analog Array (FPAA) Placement and Routing, IEEE Transactions on Circuits and Systems—II, vol. 56, No. 7, Jul. 2009.*

(Continued)

*Primary Examiner* — Mary C Jacob
*Assistant Examiner* — Scott S Cook
(74) *Attorney, Agent, or Firm* — Kevin T. Cuenot

(57) ABSTRACT

Processing a circuit design can include determining a first set of net sensitivity ranges for a net of the circuit design, wherein at least two net sensitivity ranges of the first set are partially overlapping, and translating the first set of net sensitivity ranges into a second set of net sensitivity ranges comprising a plurality of member net sensitivity ranges with no partially overlapping member net sensitivity ranges. A net sensitivity tree can be constructed that includes hierarchically ordered nodes. Each node can specify a net sensitivity range of one member of the second set of net sensitivity ranges.

16 Claims, 5 Drawing Sheets

(56) References Cited

U.S. PATENT DOCUMENTS

| | | |
|---|---|---|
| 2009/0307638 A1 | 12/2009 | McConaghy |
| 2010/0198758 A1* | 8/2010 | Gupta et al. ............... 706/12 |
| 2010/0332202 A1* | 12/2010 | Nakhla et al. ............... 703/2 |

OTHER PUBLICATIONS

The VHDL Golden Reference Guide, Version 1.1, Dec. 1995, DOULOS, Chuch Hatch 22 Market Place, Ringwood Hampshire BH24 1AW England.*

Breuer M.A., Functional Partitioning and Simulation of Digital Circuits, IEEE Transactions on Computer, vol. C-19, No. 11, Nov. 1970.*

Brocco, L.M., Macromodeling CMOS Circuits for Timing Simulation, RLE Technical Report No. 529, Jun. 1987.*

Newton, A.R., Techniques for the Simulation of Large-Scale Integrated Circuits, IEEE Transactions on Circuits and Systems, vol. CAS-26, No. 9, Sep. 1979.*

Rewienski, M., A Perspective on Fast-SPICE Simulation Technology, Synopsys Inc., Springer Scienc+Business Media B.V. 2011.*

Saleh, R.A., The Exploration of Latency and Multirate Behavior Using Nonlinear Relaxation for Circuit Simulation, IEEE Transactions on Computer-Aided Design. vol. 8. No. 12, Dec. 1989.*

Sakallah, K.A., SAMSON2: An Event Driven VLSI Circuit Simulator, IEEE Transactions on Computer-Aided Design, vol. CAD-4, No. 4. Oct. 1985.*

Simulator Defined McGRAW-Hill Dictionary of Physics and Mathematics, 1978.*

Riddle, W.E., et al., "Modeling and Simulation in the Design of Complex Software Systems," [Online] IP.com No. IPCOM000151040D, Jul. 31, 1978, 34 pgs.

Rosenblum, D.S., et al., "Simulation of an Ultracomputer With Several 'Hot Spots'," [Online] Technical Report, IP.com IPCOM000150524D, Jun. 30, 1986, Stanford University, Dept. of Computer Science STAN-CS-86-1119, 36 pgs.

U.S. Appl. No. 13/188,407, filed Jul. 21, 2011, Hem C. Neema et al., Xilinx, Inc. 2100 Logic Drive, San Jose, CA USA.

* cited by examiner

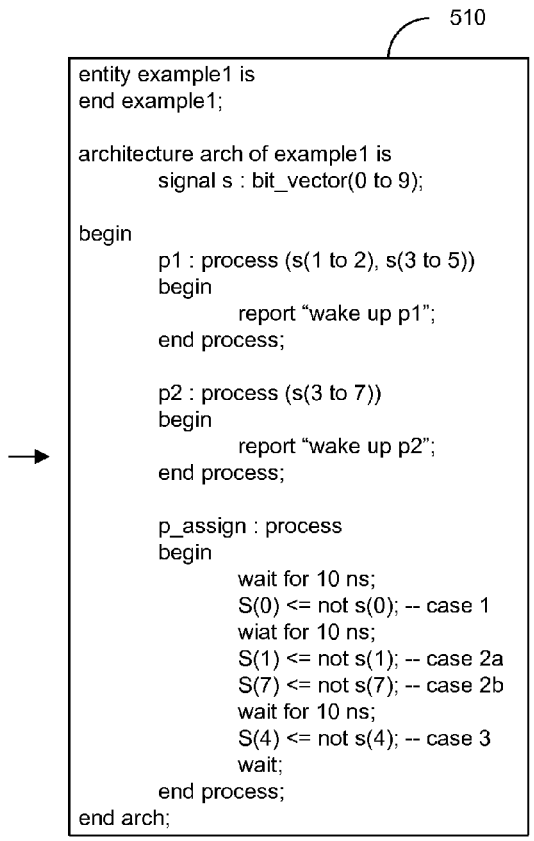

```
300
entity example1 is
end example1;

architecture arch of example1 is
        signal s : bit_vector(0 to 9);
begin
        p1 : process (s(3 to 7))
        begin -- do something end process;

end arch
```

FIG. 3

```
400
Port(a : in bit_vector(0 to 3));

Inst : my_component port map (a => s(3 to 6));
```

FIG. 4

505
```
entity example1 is
end example1;

architecture arch of example1 is
        signal s : bit_vector(0 to 9);

begin
        p1 : process (s(1 to 5))
        begin
                report "wake up p1";
        end process;

p2 : process (s(3 to 7))
        begin
                report "wake up p2";
        end process;

p_assign : process
        begin
                wait for 10 ns;
                S(0) <= not s(0); -- case 1
                wiat for 10 ns;
                S(1) <= not s(1); -- case 2a
                S(7) <= not s(7); -- case 2b
                wait for 10 ns;
                S(4) <= not s(4); -- case 3
                wait;
        end process;
end arch;
```

510
```
entity example1 is
end example1;

architecture arch of example1 is
        signal s : bit_vector(0 to 9);

begin
        p1 : process (s(1 to 2), s(3 to 5))
        begin
                report "wake up p1";
        end process;

p2 : process (s(3 to 7))
        begin
                report "wake up p2";
        end process;

p_assign : process
        begin
                wait for 10 ns;
                S(0) <= not s(0); -- case 1
                wiat for 10 ns;
                S(1) <= not s(1); -- case 2a
                S(7) <= not s(7); -- case 2b
                wait for 10 ns;
                S(4) <= not s(4); -- case 3
                wait;
        end process;
end arch;
```

FIG. 5

1000 procedure transaction_function (net, new_value, new_value_range)

var current_value_copy := current value for the net;
   var net_top_NSR := top NSR for the net;
   var current_NSR;
   var child_NSR;
   var current_value_at_overlap;
   var new_value_at_overlap;

begin if (current_value_copy = new_value) then
     return;
   else
     apply new_value to the net; { update net value } current_NSR := net_top_NSR;

DO_PROCESS_NSR_TREE { with current_NSR as the tree top }:
   schedule the processes associated with current_NSR;
   for each child_NSR of current_NSR do
     NSR_overlap := overlap between child_NSR and new_value_range;
     if ( NSR_overlap <> null ) then
       current_value_at_overlap := current_value_copy at NSR_overlap;
       new_value_at_overlap := new_value at NSR_overlap;
       if ( current_value_at_overlap <> new_value_at_overlap ) then
         DO_PROCESS_NSR_TREE { with child_NSR as the tree top };

end;

FIG. 10

NET SENSITIVITY RANGES FOR DETECTION OF SIMULATION EVENTS

RESERVATION OF RIGHTS IN COPYRIGHTED MATERIAL

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

FIELD OF THE INVENTION

One or more embodiments disclosed within this specification relate to simulation of a circuit design and, more particularly, to simulation of a circuit design specified in a hardware description language.

BACKGROUND

A hardware description language (HDL) refers to a computer-language that facilitates the documentation, design, and manufacturing of a digital system, such as an integrated circuit. An HDL combines program verification techniques with expert system design methodologies. Using an HDL, for example, a user can design and specify an electronic circuit, describe the operation of the circuit, and create tests to verify operation of the circuit. In general, an HDL includes standard, text-based expressions of the spatial and temporal structure and behavior of the electronic system being modeled. HDL syntax and semantics include explicit notations for expressing concurrency. In contrast to most software programming languages, an HDL also includes an explicit notion of time, which is a primary attribute of a digital system.

An HDL simulator refers to a program that can simulate operation of a circuit design that is specified in an HDL. Simulated operation of the circuit design in this form facilitates design verification in which the user is able to compare the intended functionality of the circuit design with the HDL implementation of the circuit design.

SUMMARY

One or more embodiments disclosed within this specification relate to simulation of a circuit design and, more particularly, to simulation of a circuit design specified in a hardware description language (HDL).

An embodiment can include a method of processing a circuit design. The method can include determining a first set of net sensitivity ranges for a net of the circuit design, wherein at least two net sensitivity ranges of the first set are partially overlapping, and translating the first set of net sensitivity ranges into a second set of net sensitivity ranges including a plurality of member net sensitivity ranges with no partially overlapping member net sensitivity ranges. The method also can include constructing a net sensitivity tree including hierarchically ordered nodes. Each node can specify a net sensitivity range of one member of the second set of net sensitivity ranges.

Another embodiment can include a storage medium having a data structure for one or more data objects encoded thereon. The data structure can include a net sensitivity tree representing a net of a circuit design, wherein the net sensitivity tree comprises a plurality of nodes. Each node of the net sensitivity tree can specify a net sensitivity range and a process of a simulation that is dependent upon a signal within the net sensitivity range of the node.

Another embodiment can include a non-transitory computer-readable medium having instructions which, when executed by a processor, perform one or more operations. The operations can include determining a first set of net sensitivity ranges for a net of the circuit design, wherein at least two net sensitivity ranges of the first set are partially overlapping, and translating the first set of net sensitivity ranges into a second set of net sensitivity ranges including a plurality of member net sensitivity ranges with no partially overlapping member net sensitivity ranges. The operations further can include constructing a net sensitivity tree including hierarchically ordered nodes, wherein each node specifies a net sensitivity range of one member of the second set of net sensitivity ranges.

BRIEF DESCRIPTION OF THE DRAWINGS

FIG. 3 illustrates an example of HDL code in accordance with another embodiment disclosed within this specification.

FIG. 4 illustrates an example of HDL code in accordance with another embodiment disclosed within this specification.

FIG. 5 illustrates an example of net sensitivity range (NSR) transformation in accordance with another embodiment disclosed within this specification.

FIG. 10 is an example of a transaction function of a net in accordance with another embodiment disclosed within this specification.

DETAILED DESCRIPTION OF THE DRAWINGS

While the specification concludes with claims defining features of one or more embodiments that are regarded as novel, it is believed that the one or more embodiments will be better understood from a consideration of the description in conjunction with the drawings. As required, one or more detailed embodiments are disclosed within this specification. It should be appreciated, however, that the one or more embodiments are merely exemplary. Therefore, specific structural and functional details disclosed within this specification are not to be interpreted as limiting, but merely as a basis for the claims and as a representative basis for teaching one skilled in the art to variously employ the one or more embodiments in virtually any appropriately detailed structure. Further, the terms and phrases used herein are not intended to be limiting, but rather to provide an understandable description of the one or more embodiments disclosed herein.

One or more embodiments disclosed within this specification relate to simulation of a circuit design and, more particularly, to simulation of a circuit design specified in a hardware description language. The inventive arrangements disclosed within this specification allow a hardware description language (HDL) simulator to determine, at runtime of the simulation, which processes of the simulation require scheduling to resume execution when a particular signal of the circuit design being simulated is active. Information relating to net sensitivity ranges of functions can be determined during compilation of the circuit design. In general, net sensitivity ranges can be translated into a resulting set of net sensitivity ranges in which the resulting ranges are disjoint and/or in which ranges completely overlap. Net sensitivity trees can be formed from the translated net sensitivity ranges. The net sensitivity trees can be used to generate transaction functions for the simulation that determine which processes to resume at simulation time.

Figure 1:
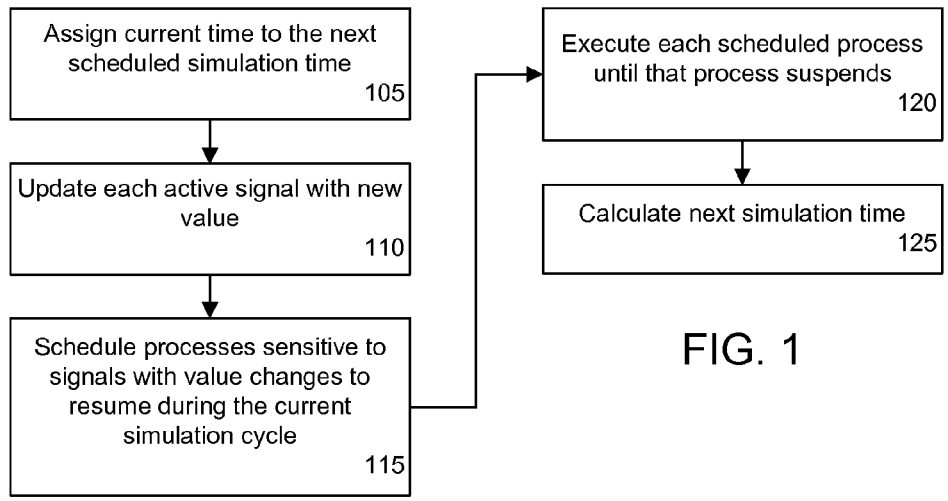
FIG. 1 is a flow chart illustrating an exemplary simulation cycle of a hardware description language (HDL) simulator in accordance with an embodiment disclosed within this specification.

FIG. 1 is a flow chart illustrating an exemplary simulation cycle 100 of an HDL simulator in accordance with an embodiment disclosed within this specification. In general, during HDL simulation, a simulator executes a loop referred to as a simulation cycle. The simulation cycle governs the execution of the simulation as a whole and continues to repeat until the simulation stops. Referring to FIG. 1, simulation cycle 100 can be performed by a system such as a data processing system executing suitable operational software, e.g., an operating system and a simulation executable, to be described herein in greater detail.

In block 105, the system can assign the current time to the next scheduled simulation time. In block 110, the system can update each active signal with a new value. An active signal is any signal that is scheduled for a value update during the current simulation time. In block 115, the system can schedule processes sensitive to, e.g., dependent upon, nets, or portions thereof (e.g., signals), with value changes to resume during the current simulation cycle. In block 120, the system can execute each scheduled process until that process suspends. In block 125, the system can calculate the next simulation time. After block 125, the simulation cycle can repeat until such time that the simulation is stopped.

Referring to FIG. 1, blocks 110 and 115 can require significant time to perform thereby slowing the speed of the simulation. For example, in some cases the new value assigned to a signal of a net is the same as the previous value assigned to the signal. In such cases, processes dependent upon the signal need not be resumed since the value of the signal is unchanged. In other cases, processes of the simulation may be dependent upon one portion of a net, but not upon another portion of the net. Only those processes that are dependent upon a changed portion (signals) of the net need be resumed.

In one aspect, block 115 can be performed with the aid of data structures referred to as a net sensitivity trees. A net sensitivity tree can be generated by a compiler on a per net basis and used to generate the transaction functions responsible for scheduling processes dependent upon changed signals of nets.

Figure 2:
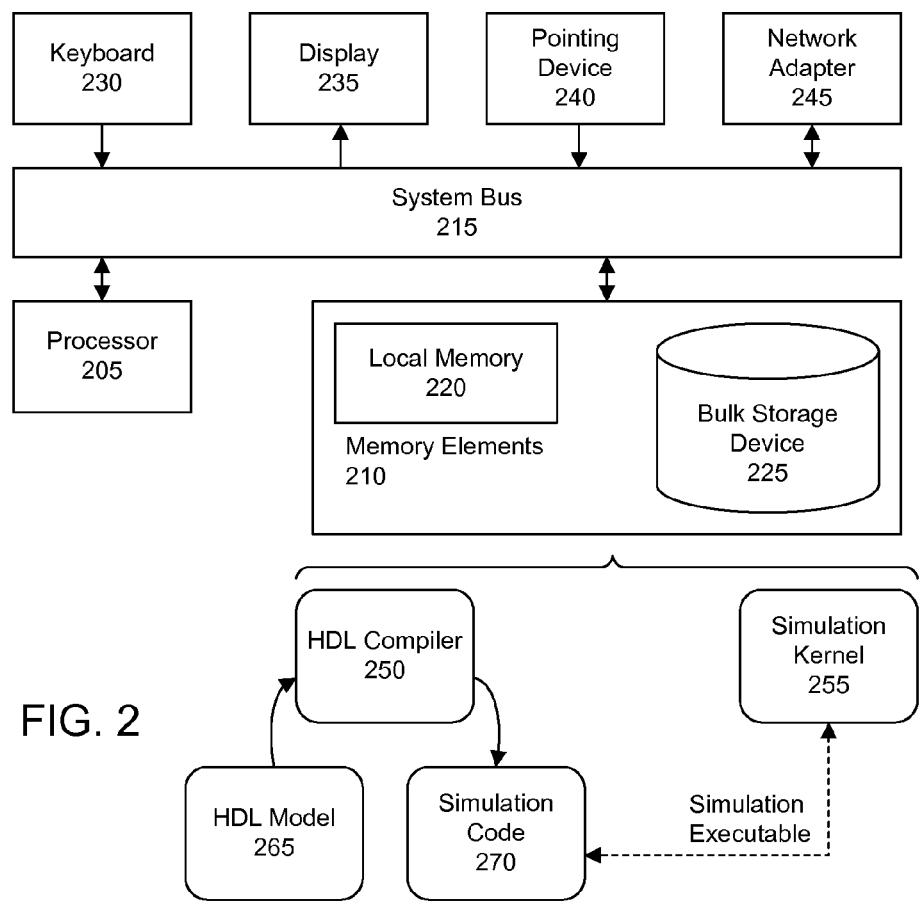
FIG. 2 is a block diagram illustrating an exemplary data processing system in accordance with an embodiment disclosed within this specification.

FIG. 2 is a block diagram illustrating an exemplary data processing system (system) 200 in accordance with an embodiment disclosed within this specification. System 200 can include at least one processor 205 coupled to memory elements 210 through a system bus 215 or other suitable circuitry. As such, system 200 can store program code within memory elements 210. Processor 205 can execute the program code accessed from memory elements 210 via system bus 215. In one aspect, for example, system 200 can be implemented as a computer that is suitable for storing and/or executing program code. It should be appreciated, however, that system 200 can be implemented in the form of any system including a processor and memory that is capable of performing the functions described within this specification.

Memory elements 210 can include one or more physical memory devices such as, for example, local memory 220 and one or more bulk storage devices 225. Local memory 220 refers to random access memory or other non-persistent memory device(s) generally used during actual execution of the program code. Bulk storage device(s) 225 can be implemented as a hard drive or other persistent data storage device. System 200 also can include one or more cache memories (not shown) that provide temporary storage of at least some program code in order to reduce the number of times program code must be retrieved from bulk storage device 225 during execution.

Input/output (I/O) devices such as a keyboard 230, a display 235, and a pointing device 240 optionally can be coupled to system 200. The I/O devices can be coupled to system 200 either directly or through intervening I/O controllers. A network adapter 245 also can be coupled to system 200 to enable system 200 to become coupled to other systems, computer systems, remote printers, and/or remote storage devices through intervening private or public networks. Modems, cable modems, and Ethernet cards are examples of different types of network adapter 245 that can be used with system 200.

As illustrated, memory elements 210 can include an HDL compiler 250, and a simulation kernel 255. In general, HDL compiler 250 can receive HDL model 265 and compile, e.g., translate, HDL model 265 into simulation code 270. HDL model 265 is a programmatic, e.g., an HDL, representation of a circuit design. Simulation code 270 is a representation of the circuit design that, unlike HDL, can be executed by a data processing system such as system 200. For example, while HDL model 265 is specified in an HDL, simulation code 270 can be specified in a different high-level language, e.g., C or the like, that is not specifically intended or designed to model hardware. For example, simulation code 270 does not include an explicit notion of time as does HDL model 265.

Simulation kernel 255 can be implemented as a library of one or more executable functions that can be installed on system 200 as part of a simulation environment. Simulation kernel 255, for example, can include utilities such as a time-managing event queue, simulation run control providing access to the operating system file system of system 200, and/or value-processing functions. In one aspect, the complied version of HDL model 265, i.e., simulation code 270, and simulation kernel 255 can be linked together during the compilation process implemented by HDL compiler 250 in a machine executable that can be referred to as the "simulation executable."

For purposes of illustration and explanation, the term "runtime" is used to refer to the time at or during which a circuit design is simulated. "Runtime" can be used interchangeably with the phrase "simulation time" and "during simulation." Runtime (simulation time) is to be distinguished from "compile time." "Compile time" refers to the time at or during which operations performed by HDL compiler 250 are implemented in processing HDL model 265 to produce simulation code 270 and/or the simulation executable. Thus, runtime refers to the time period after the simulation executable is generated and executed for purposes of simulating the circuit design.

Simulation code 270, being the compiled or translated version of HDL model 265 that is executable, can include a variety of different types of processes each created by HDL compiler 250. In one aspect, simulation code 270 can include two different process types. A first type of process can be an "execute function" that refers to portions of HDL model 265 that are translated into executable functions. An execute function, in general, includes the procedural logic, or a portion thereof, of HDL model 265. Value changes, for example, assignments to variables, occur directly within execute functions.

A second type of process can be a "transaction function." Each net of the circuit design, for example, can be assigned a value within a transaction function. In general, each net of the circuit design, as represented within simulation code 270, can include a transaction function, e.g., one transaction function created by HDL compiler 250. Each transaction function for a net can be configured to perform the actual assignment of a new value to the net. In addition, each transaction function for a given net is configured to notify a set of one or more executable processes that are dependent upon the net that an assignment of a value has occurred for the net.

HDL compiler 250 can be configured to translate net sensitivity ranges (NSRs) within HDL model 265 to a set of NSRs in which the member NSRs are disjoint and/or completely overlap. Net sensitivity trees can be formed from the translated NSRs. The net sensitivity trees are data structures that can be used to determine which processes, e.g., execute functions, to resume at simulation time. More particularly, HDL compiler 250 is configured to generate the transaction functions of simulation code 270 and configure the transaction functions according to the net sensitivity trees to determine which execute functions to resume at runtime for a given simulation.

The term "net" within this specification refers to a collection of two or more signals that are represented programmatically and which can be referenced as a single unit or entity within a circuit design specified in an HDL. The constituent signals of the net can be homogeneous or heterogeneous in type. Examples of signal types can include bits (individual wires), integers, floating point values, or the like. A homogenous net will include only signals of a same type. Exemplary types can include bits, integers, floating point values, or other data types that are supported by an HDL. An example of a homogeneous net will include all bits or all integers or all floating point values. A heterogeneous net will include signals of two different types. A non-limiting example of a heterogeneous net includes HDL record types. Programmatically, e.g., in HDL, updating net values can be specified using wire assignment statements (Verilog), signal assignment statements (VHDL), or the like.

As noted, the execute functions that are dependent upon changed nets are resumed during simulation. Appreciably, since nets can have a plurality of constituent elements, referred to as signals within this specification, only the processes that are dependent upon the particular signals of a net that have changed value need be resumed. Those execute functions that have no value changes on any dependent signal of a net need not be resumed. The one or more embodiments disclosed within this specification can reduce the number of comparisons necessary to determine which execute functions to resume, thereby increasing the efficiency and speed of a simulation.

FIG. 3 illustrates an example of HDL code in accordance with another embodiment disclosed within this specification. One or more of the examples included within this specification are illustrated using VHDL code or VHDL style pseudo code. It should be appreciated, however, that the one or more embodiments disclosed herein can be implemented using Verilog or another HDL. Accordingly, use of one particular type of HDL or pseudo code version of an HDL is not intended to limit the one or more embodiments disclose herein.

FIG. 3 illustrates an example of an NSR that is identified by system 200 of FIG. 2 from a process sensitivity list of a circuit design. As shown, a net "s" is defined that includes signals 0 through 9. FIG. 3 further illustrates that a process, e.g., an execute function, referred to as "p1" depends upon a subset of the signals of net s. In particular, process p1 depends upon signals 3-7 of net s. Accordingly, net s can be said to have an NSR of 3-7, which can be represented as NSR [3:7].

FIG. 4 illustrates an example of HDL code in accordance with another embodiment disclosed within this specification. FIG. 4 illustrates an example of an NSR that is identified by system 200 of FIG. 2 from a port connection of a circuit design. As shown, a port "a" is mapped to signals 3 to 6 of net s. Accordingly, net s includes another NSR of [3:6]. Referring to FIGS. 3 and 4 collectively, net s can be said to be associated with two NSRs, i.e., NSR [3:7] and NSR [3:6].

FIG. 5 illustrates an example of an NSR transformation in accordance with another embodiment disclosed within this specification. FIG. 5 illustrates a transformation that can be performed by a system such as system 200 as described with reference to FIG. 2 of this specification. Like numbers will be used to refer to the same items throughout this specification.

As shown, HDL code 505 includes a process p1 that is dependent upon signals 1 to 5 of net s. Process p1 corresponds to a runtime function, e.g., an execute function generated from, or representing, process p1 for the simulation after compilation. HDL code 505 further includes a process p2, e.g., another function to be implemented as a runtime function such as an execute function from compilation, that is dependent upon signals 3 to 7 of net s. Thus, with respect to HDL code 505, net s is associated with NSR [1:5] and NSR [3:7]. NSR [1:5] and NSR [3:7] can be said to partially overlap in that a portion NSR [1:5] is included within NSR [3:7]. More particularly, partial overlap, or partially overlapping NSRs, refers to a situation in which a starting index of a first NSR, e.g., NSR [1:5] which is 1, is less than the starting index of a second NSR, e.g., NSR [3:7], and the ending index of the first NSR, which is 5, is greater than or equal to the starting index of the second NSR and less than the ending index of the second NSR. The starting index of each NSR is the first number specified in the brackets. The ending index of each NSR is the second number specified in the brackets.

By comparison, completely overlapping NSRs refer to a situation in which one NSR is fully incorporated within another NSR. A first NSR that is completely overlapped by a second NSR has a starting index that is greater than or equal to the starting index of the second NSR and an ending index that is less than or equal to the ending index of the second NSR. An example of completely overlapping NSRs is be NSR [2:4] being completely overlapped by NSR [1:5].

Referring to HDL code 505, when an assignment is made to net s during simulation, the simulator must determine whether any of NSRs [1:5] or [3:7] includes a signal to which an assignment has been made. If so, the simulator further determines whether the value assigned to the signal(s) is different from the prior value of the signal(s). Responsive to determining that a value for one of the signal(s) has changed, the simulator schedules the processes dependent upon those signals for execution.

Were the NSRs determined from HDL code 505 to be used, the simulator would perform a series of redundant comparisons. For example, consider the case in which an assignment occurs to signals 2 to 6 of net s (e.g., s(2 to 6)). The simulator would need to compare the old and new values for signals 2-5 of net s for NSR [1:5] and the compare the old and new values for signals 3-6 of net s for NSR [3:7]. As such, the simulator performs redundant comparisons for the partially overlapped range corresponding to signals 3-5.

System 200, as described with reference to FIG. 2, can perform an NSR translation during compilation that transforms HDL code 505 to HDL code 510. Within HDL code 510, NSR [1:5] has been split into two different NSRs. More particularly, NSR [1:5] from HDL code 505 has been split into NSR [1:2] and NSR [3:5] within HDL code 510. The total number of NSRs has increased from two within HDL code 505 to three within HDL code 510.

Thus, a first set of NSRs from HDL code 510 are translated into a second set of NSRs. Whereas the first set of NSRs included partially overlapping member NSRs, the second set of NSRs includes only disjoint NSRs or completely overlapping NSRs. The second set of NSRs do not include any partially overlapping NSRs. For example, NSR [1:2] is disjoint with respect to NSR [3:5] in that no signals are shared between the two. Further, NSR [3:5] is completely overlapped by NSR [3:7] in that each signal of NSR [3:5] is included within NSR [3:7].

Figure 6:
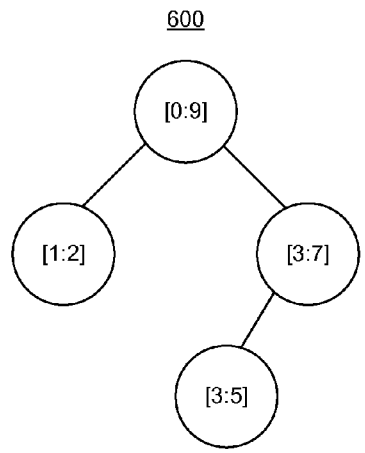
FIG. 6 is a view of a net sensitivity tree in accordance with another embodiment disclosed within this specification.

FIG. 6 is a view of a net sensitivity tree 600 in accordance with another embodiment disclosed within this specification. Net sensitivity tree 600 is a data structure that can be generated by an HDL compiler from the second set of NSRs referring to the set of NSRs described in HDL code 510 of FIG. 5. In general, a net sensitivity tree can be created for one or more or all nets (e.g., each net) of a circuit design.

Accordingly, each net sensitivity tree provides an efficient mechanism for determining which execute functions to resume during simulation given changes to values of signals for a net. Each pair of NSRs, such as the two NRSs of code 505 of FIG. 5, divides the net into a plurality of mutually disjoint areas that include (1) areas outside of both NSRs; (2) areas belonging to one of the NSRs, but outside of another NSR; and (3) areas that are overlapping.

Referring to FIG. 6, the root node of net sensitivity tree 600 is the signal range corresponding to the whole net that is represented, e.g., net s in this case. The root node in net sensitivity tree 600 is labeled [0:9]. Each node of net sensitivity tree 600 beneath the root node corresponds to one of the members of the second set of NSRs corresponding to those NSRs derived from HDL code 510 of FIG. 5. Net sensitivity tree 600 is constructed so that all child nodes specify ranges that are sub-ranges, e.g., completely overlapped by, the range of the parent node. Each sibling range is disjoint, e.g., node [1:2] is disjoint from node [3:7].

Each of the nodes of net sensitivity tree 600 can be associated with one or more processes that are sensitive to, e.g., depend upon, the signals specified in the node. As such, when a value of a signal changes for a signal specified in a node, the processes associated with that node must be resumed during simulation. In one aspect, each node can include or specify a list of one or more dependent processes. In another aspect, each process, e.g., execute function, can be associated with a list of one or more NSR nodes that the process is dependent upon. For example, node [1:2] is associated with process p1. Node [3:7] is associated with process p2. Node [3:5] is associated with process p1. Thus, as illustrated, a process can be associated with more than one node of a net sensitivity tree due to the translation of NSRs illustrated with respect to FIG. 5.

For purposes of discussion, the comparisons needed to be performed by a simulator are described with reference to cases 1, 2a, 2b, and 3 as set forth in the comments of HDL code illustrated in FIG. 5. Using a net sensitivity tree as described with reference to FIG. 6, the simulator can determine the particular processes that are to be resumed given changes to signals in net s.

Case 1 refers to an assignment to s(0), which is outside of the first set of NSR ranges (i.e., [1:5] and [3:7]) and the second set of NSR ranges (i.e., [1:2], [3:5], and [3:7]). In case 1, no comparisons of whether the value of s(0) has changed need be performed since s(0) is outside of the NSR ranges. Thus, in case 1 the transformation does not produce a reduction in the comparisons performed at simulation time.

Case 2a refers to an assignment to s(1). Referring to the first set of NSRs corresponding to HDL code 505, the simulator must perform a comparison for NSR [1:5], which has a range of [1:5]. Referring to the second set of NSRs corresponding to HDL code 510, the simulator need only perform a comparison of NSR [1:2], which has a range of [1:2], which is smaller than had no NSR transformation been performed. Fewer comparisons are required at simulation time.

Case 2b refers to an assignment of s(7). Referring to the first set of NSRs corresponding to HDL code 505, the simulator must perform a comparison for NSR [3:7]. Referring to the second set of NSRs corresponding to HDL code 510, the simulator also needs to perform a comparison of NSR [3:7]. Thus, in case 2b the transformation does not produce a reduction in the comparisons performed by the simulator at runtime.

Case 3 refers to an assignment to s(4). Referring to the first set of NSRs corresponding to HDL code 505, the simulator must perform a comparison for NSR [1:5] and for NSR [3:7]. Referring to the second set of NSRs corresponding to HDL code 510, the simulator need only perform a comparison of NSR [3:7]. Fewer comparisons are required at runtime. The reduction in comparisons corresponds to the range [1:5], which is not used for purposes of comparison when using net sensitivity tree 600. Further, since node [3:5] is a child of node [3:7], comparisons for node [3:5] need not be performed independently of node [3:7] if no value change is found at the comparison for NSR [3:7].

Referring to cases 2a and 3, using NSR transformation and net sensitivity trees, a smaller number comparisons are required resulting in improved simulation performance. In general, the reduction in the number of comparisons is proportional to the length of the partial overlap. In other cases, e.g., cases 1 and 2b, the same number of comparisons are required.

Figure 7:
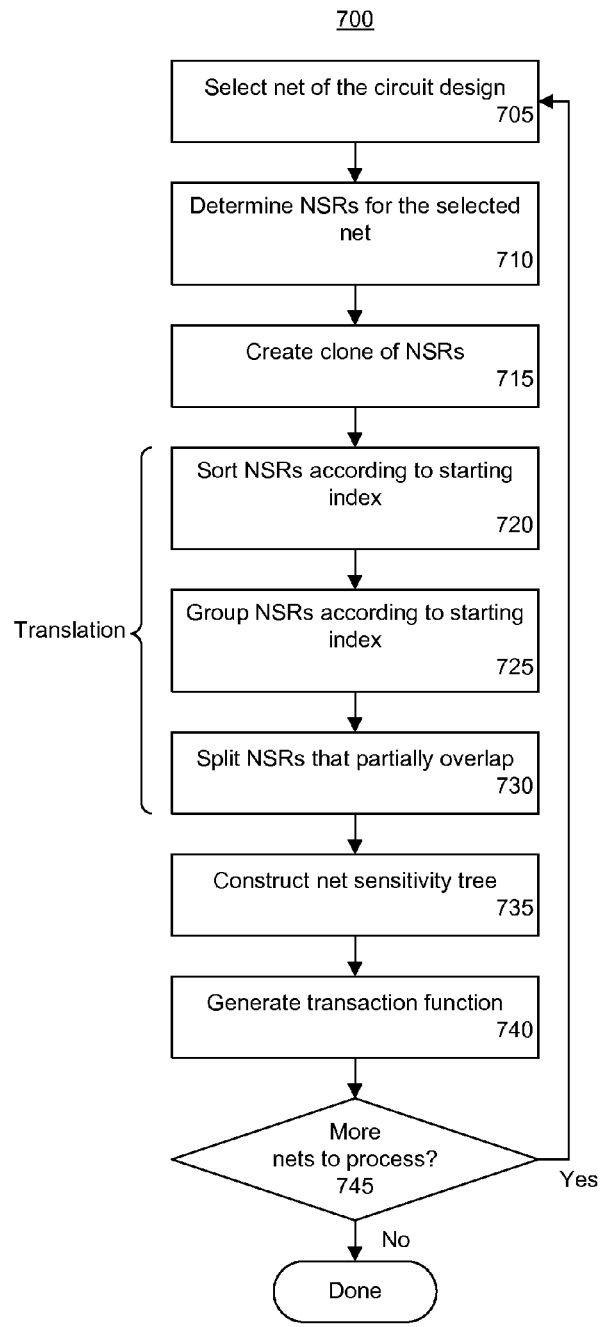
FIG. 7 is a flow chart illustrating a method of NSR transformation in accordance with another embodiment disclosed within this specification.

FIG. 7 is a flow chart illustrating a method 700 of NSR transformation in accordance with another embodiment disclosed within this specification. Method 700 can be performed by a system as described with reference to FIG. 2 of this specification. As such, method 700 is performed as part of compilation, e.g., during compilation, by the system.

In block 705, the system can select a net of the circuit design that is being compiled for purposes of HDL simulation. In block 710, the system can determine the NSRs for the selected net. The system determines the first set of NSRs, which correspond to the NSRs for the selected net prior to any translation. For example, consider the case in which the selected net includes NSR [0:9], NSR [0:5], NSR [2:8], NSR [3:5], and NSR [3:8].

In block 715, the system can create a clone, e.g., a copy, of the NSRs. For purposes of discussion, further processing of the NSRs can be performed upon the cloned versions of the NSRs, thereby maintaining an unprocessed set or original NSRs from the circuit design. In one aspect, collection of NSRs for nets of a circuit design can be performed during an earlier phase of compilation. Accordingly, for any given net, the set of NSRs for the net are already determined and available. Further, creation of clone NSRs can be performed for the entire circuit design in one block if so desired rather than as each net is selected for processing as shown in FIG. 7.

Blocks 720-730, taken collectively, represent the translation process in which the first set of net sensitivity ranges are translated into a second set of net sensitivity ranges. The second set of net sensitivity ranges, unlike the first set of net sensitivity ranges, includes a plurality of member net sensitivity ranges with no partially overlapping member net sensitivity ranges.

Accordingly, in block 720, the system can sort the NSRs of the first set according to the starting index of each NSR. In block 725, the system can group the NSRs according to the starting index. Thus, the system generates three groups according to starting indices of 0, 2, and 3. The system can create a group 1 including NSR [0:9] and NSR [0:5]; a group 2 including NSR [2:8]; and group 3 including NSR [3:5] and NSR [3:8]. The groups also can be ordered according to the starting index of each group.

In block 730, the system can split NSRs that partially overlap one another into one or more NSRs forming the second set of NSRs. In one aspect, for example, the system can utilize a technique in which a group of NSRs is selected as a pre-group and another group of NSRs is selected as a current-group. In general, when the system determines that a member NSR of the pre-group extends into the range defined by any NSR of the current-group, i.e., partially overlaps, the NSR of the pre-group is split. The system generates the following groups and NSRs through implementation of block 730: group 1 including NSR [0:9] and NSR [0:1]; group 2 including NSR [2:8] and NSR [2:2]; and group 3 including NSR [3:8] and NSR [3:5].

In block 735, the system constructs a net sensitivity tree from the second set of NSRs that are generated in block 730. In general, each resulting NSR becomes a node of the net sensitivity tree. As discussed, each execute function that depends upon an NSR of the second set is either specified by the node in the net sensitivity tree that corresponds to the NSR of the process or is specified in a list of execute functions that is associated with the node. In block 740, the system can generate a transaction function for the net based upon the net sensitivity tree constructed in block 735.

In block 745, the system can determine whether any further nets remain to be processed. Responsive to determining that one or more nets remain to be processed, method 700 can loop back to step 705 to select a next net and continue processing. Responsive to determining that no further nets remain to be processed, method 700 can end.

Figure 8:
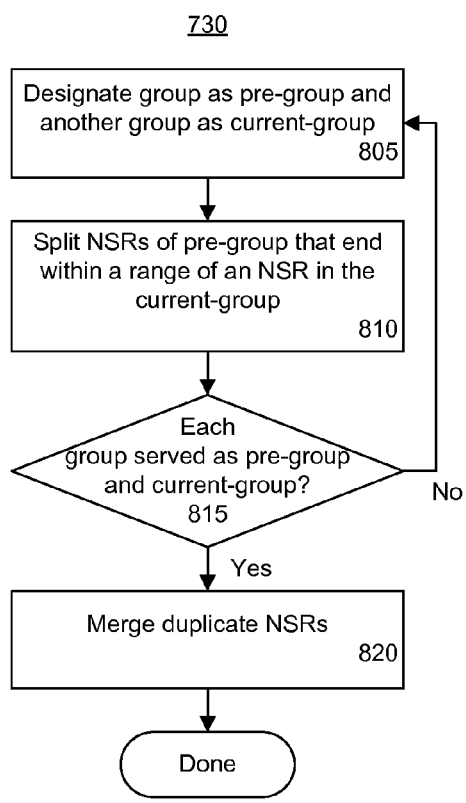
FIG. 8 is a flow chart illustrating an NSR splitting technique in accordance with another embodiment disclosed within this specification.

FIG. 8 is a flow chart illustrating the splitting process described with reference to FIG. 7 in accordance with another embodiment disclosed within this specification. More particularly, FIG. 8 describes the operations performed in block 730 of FIG. 7 in greater detail. For purposes of illustration, the same groupings described with reference to FIG. 7 are used. Thus, the groups corresponding to the first set of NSRs include group 1 including NSR [0:9] and NSR [0:5]; group 2 including NSR [2:8]; and group 3 including NSR [3:5] and NSR [3:8].

In block 805, the system designates a group as the pre-group and another group as the current-group. In performing block 805, the system operates under the condition that the starting index of the pre-group is less than the starting index of the current group. The designation is performed in ascending order according to the starting index of each group. For example, the system designates group 1 having a starting index of 0 as the pre-group. The system designates the next group in ascending order according to the starting index as the current-group. Accordingly, the system designates group 2 with a starting index of 2 as the current-group.

In block 810, the system splits each NSR of the pre-group that extends into, or ends within, a range of an NSR in the current-group. Continuing with example above, the system determines that NSR [0:9] of group 1 does not end within any NSR of group 2 and, as such, is not split. The system determines that the ending index of 9 is not greater than or equal to the starting index and less than the ending index of any NSR in group 2.

The system determines that NSR [0:5] of group 1, however, does extend into the range of one or more NSRs of group 2. In particular, NSR [0:5], having an ending index of 5 is greater than or equal to the starting index and less than the ending index of NSR [2:8] of group 2. As such, NSR [0:5] is split. The system splits NSR [0:5] into two different NSRs in which the first resulting NSR includes the same starting index and has an ending index that is one below the starting index of the current-group and the second resulting NSR includes a starting index that is the same as the current-group and an ending index that is the same as the ending index of the NSR that is being split. Thus, the system splits NSR [0:5] into NSR [0:1] and NSR [2:5].

The splitting performed in block 810 is iterative in that each NSR of the pre-group is evaluated with respect to the NSRs of the current-group. Further, as new NSRs are generated, e.g., NSR [0:1] and NSR [2:5], such NSRs are assigned to the proper group according to starting index and evaluated accordingly. Thus, NSR [0:1] is evaluated as part of group 1 (the pre-group), but is left intact since NSR [0:1] does not extend into any NSR in the current-group. In general, the NSR that is generated and that remains in the pre-group will not require further splitting since the current-group starting index is used as the splitting point. NSR [2:5], however, becomes part of group 2.

Having processed each NSR in the pre-group (e.g., group 1), the system proceeds to block 815. In block 815, the system determines whether each of the groups, e.g., group 1, 2, and 3, has been designated as a pre-group and as a current-group during splitting process 730. Splitting process 730 can continue to iterate through the groups until each group is used as a pre-group and as a current-group. Responsive to determining that each group has been designated as a pre-group and as a current-group at some point during splitting process 730, the system continues to block 820. If there is any group that has not been designated as a pre-group and a current-group at some point during splitting process 730, the system loops back to block 805.

Each iteration through block 805, the system designates a new group as the pre-group and a new group as the current-group. As such designations are performed in ascending order, group 2 is designated as the pre-group and group 3 is designated as the current-group. As noted, NSR [2:5] is now part of group 2.

Accordingly, during the next iteration of splitting process 730, the system evaluates NSRs of group 2 (the pre-group) and determines whether any NSR of group 2 has an ending index within a range defined by one of the NSRs of group 3

(the current-group). The system determines that NSR [2:8] does not since the ending index 8 is not greater than or equal to the starting index and less than the ending index of any NSR of group 3. In this example, while the ending index is the same as one NSR of group 3, the ending index is not less than the ending index of NSR [3:8].

The system determines, however, that NSR [2:5] having an ending index of is greater than or equal to the starting index and less than the ending index of NSR [3:8] of group 3. As such, NSR [2:5] is split. The system splits NSR [2:5] as described into NSR [2:2] and NSR [3:5]. NSR [2:2] remains part of group 2. NSR [3:5] becomes a member of group 3. The process can continue to iterate as described.

During the next iteration of splitting process 730, which is not described in its entirety, group 3 is selected as the pre-group and group 1 is selected as the current group.

Proceeding with block 820, the system merges any duplicate NSRs. Any properties in existence for duplicate NSRs are merged together. The system takes the properties of each NSR that is being merged and includes the properties in the resulting merged NSR. In block 820, for example, the system has the second set of NSRs that include group 1 including NSR [0:9] and NSR [0:1]; group 2 including NSR [2:8] and NSR [2:2]; and group 3 including NSR [3:8], NSR [3:5], and NSR [3:5]. In block 820, multiple instances of NSR [3:5], for example, are merged and represented as a single NSR [3:5] that includes all properties of each individual instance of NSR [3:5] prior to the merger. Since properties of an NSR include the list of execute functions the NSR is associated with, the merger combines the list of execute functions associated with each NSR being merged to form a new list of execute functions (e.g., a combined list) to be associated with the resulting NSR. Subsequent to block 820, the second group of NSRs includes the following groups: group 1 including NSR [0:9] and NSR [0:1]; group 2 including NSR [2:8] and NSR [2:2]; and group 3 including NSR [3:8] and NSR [3:5].

Figure 9:
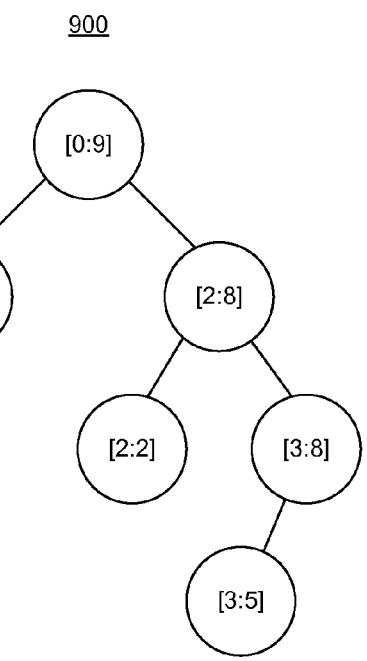
FIG. 9 illustrates an example of a net sensitivity tree in accordance with another embodiment disclosed within this specification.

FIG. 9 illustrates an example of a net sensitivity tree 900 in accordance with another embodiment disclosed within this specification. Net sensitivity tree 900 includes a plurality of hierarchically ordered nodes in which one node corresponds to each NSR of the second set of NSRs determined through the translation process. As noted, each of the nodes of net sensitivity tree 900 can specify, either directly or indirectly, the particular processes that are dependent upon that node.

In one embodiment, a net sensitivity tree 900 is generated for each net of the circuit design as part of the compilation process. The original NSRs of the circuit design can be collected in an initial phase of compilation when the system traverses the entire circuit design. NSRs can be translated and net sensitivity trees constructed in a later phase for purposes of code generation. As noted, NSR translation and net sensitivity tree construction can be performed upon the cloned NSRs. As such, the original NSRs are left intact for other compilation purposes.

The net sensitivity tree is used in generating the transaction function for the net. In this regard, the transaction function for the net that is generated by the system during compilation implements a search process that coincides with the nodal structure of the net sensitivity tree for the net. In terms of searching, for example, once the transaction function determines that a particular range (e.g., as specified by a parent node) has no event, the transaction function does not check further sub-ranges of that range (e.g., child nodes of the parent node).

The NSR tree for a net is only needed for the code generation phase when the system generates the transaction function for a net. In another embodiment, the cloned NSRs and the net sensitivity tree constructed for a net is deleted after the transaction function of the net is generated by the compiler. Memory space occupied by the deleted cloned NSRs and net sensitivity tree can be reclaimed and reused by the system for processing the next net. This results in a smaller memory usage by the system during compilation. Referring to FIG. 7, for example, the system can generate the transaction function for the selected net using the net sensitivity tree after block 735. Once the transaction function is generated for the selected net, the system can delete the cloned NSRs and net sensitivity tree of the selected net prior to processing a next net of the circuit design (e.g., continuing to block 740).

In another embodiment, during compilation, if the system determines that a net has not assignment, the NSR translation process described herein can be skipped. The NSR translation process can be skipped for a net without an assignment despite that net having a significant number of NSRs.

FIG. 10 is an example of a transaction function 1000 of a net in accordance with another embodiment disclosed within this specification. Transaction function 1000 is implemented in pseudo code and provides an exemplary implementation a net sensitivity tree within program code for execution within a simulator. Transaction function 1000 is generated by HDL compiler 250 based on the net sensitivity tree. Transaction function 1000 implements the runtime operations the simulator performs utilizing the net sensitivity tree for comparing value changes and scheduling execute functions sensitive to these value changes. Text located within braces, i.e., { }, represents explanatory comments.

At the time when the transaction function code is generated, HDL compiler 250 still has the net sensitivity tree available for the net. Accordingly, HDL compiler 250 has all constants needed inside the transaction function body (e.g., the starting/ending indexes of each NSR tree node). The constants, for example, are directly written (e.g., hard coded) into the transaction function body. Appreciably, variables such as "new value" and "new value range" within the transaction function will vary from one call of the transaction function to another. As such, the values can be passed into the transaction function using arguments.

For purposes of explanation, specific nomenclature is set forth to provide a thorough understanding of the various inventive concepts disclosed herein. The terminology used herein, however, is for the purpose of describing particular embodiments only and is not intended to be limiting. For example, reference throughout this specification to "one embodiment," "an embodiment," or similar language means that a particular feature, structure, or characteristic described in connection with the embodiment is included in at least one embodiment disclosed within this specification. Thus, appearances of the phrases "in one embodiment," "in an embodiment," and similar language throughout this specification may, but do not necessarily, all refer to the same embodiment.

The terms "a" and "an," as used herein, are defined as one or more than one. The term "plurality," as used herein, is defined as two or more than two. The term "another," as used herein, is defined as at least a second or more. The term "coupled," as used herein, is defined as connected, whether directly without any intervening elements or indirectly with one or more intervening elements, unless otherwise indicated. Two elements also can be coupled mechanically, electrically, or communicatively linked through a communication channel, pathway, network, or system.

The term "and/or" as used herein refers to and encompasses any and all possible combinations of one or more of the associated listed items. It will be further understood that the terms "includes" and/or "including," when used in this specification, specify the presence of stated features, integers, steps, operations, elements, and/or components, but do not preclude the presence or addition of one or more other features, integers, steps, operations, elements, components, and/or groups thereof. It will also be understood that, although the terms first, second, etc. may be used herein to describe various elements, these elements should not be limited by these terms, as these terms are only used to distinguish one element from another.

The term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context.

One or more embodiments can be realized in hardware or a combination of hardware and software. One or more embodiments can be realized in a centralized fashion in one system or in a distributed fashion where different elements are spread across several interconnected systems. Any kind of data processing system or other apparatus adapted for carrying out at least a portion of the methods described herein is suited.

One or more embodiments further can be embedded in a device such as a computer program product, which comprises all the features enabling the implementation of the methods described herein. The device can include a data storage medium, e.g., a non-transitory computer-usable or computer-readable medium, storing program code that, when loaded and executed in a system including a processor, causes the system to perform at least a portion of the functions described within this specification. Examples of data storage media can include, but are not limited to, optical media, magnetic media, magneto-optical media, computer memory such as random access memory, a bulk storage device, e.g., hard disk, or the like.

Accordingly, the flowchart and block diagrams in the Figures illustrate the architecture, functionality, and operation of possible implementations of systems, methods and computer program products according to various embodiments of the one or more embodiments disclosed herein. In this regard, each block in the flowchart or block diagrams may represent a module, segment, or portion of code, which includes one or more executable instructions for implementing the specified logical function(s). It should also be noted that, in some alternative implementations, the functions noted in the blocks may occur out of the order noted in the figures. For example, two blocks shown in succession may be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terms "computer program," "software," "application," "computer-usable program code," "program code," "executable code," variants and/or combinations thereof, in the present context, mean any expression, in any language, code or notation, of a set of instructions intended to cause a system having an information processing capability to perform a particular function either directly or after either or both of the following: a) conversion to another language, code, or notation; b) reproduction in a different material form. For example, program code can include, but is not limited to, a subroutine, a function, a procedure, an object method, an object implementation, an executable application, an applet, a servlet, a source code, an object code, a shared library/dynamic load library and/or other sequence of instructions designed for execution on a computer system.

Thus, throughout this specification, statements utilizing terms such as "processing" or "computing" or "calculating" or "determining" or "displaying" or the like, refer to the action and processes of a data processing system, e.g., a computer system, or similar electronic computing device, that manipulates and transforms data represented as physical (electronic) quantities within the computer system's registers and/or memories into other data similarly represented as physical quantities within the computer system memories and/or registers or other such information storage, transmission or display devices.

The corresponding structures, materials, acts, and equivalents of all means or step plus function elements in the claims below are intended to include any structure, material, or act for performing the function in combination with other claimed elements as specifically claimed.

One or more embodiments disclosed within this specification can be embodied in other forms without departing from the spirit or essential attributes thereof. Accordingly, reference should be made to the following claims, rather than to the foregoing specification, as indicating the scope of the one or more embodiments.

What is claimed is:

1. A method of hardware description language simulation for a circuit design, the method comprising:
   generating, from the circuit design and using a processor, a simulation executable, wherein generating the simulation executable comprises:
      translating, using the processor, hardware description language code comprising a first net sensitivity range of a net that partially overlaps a second net sensitivity range of the net into hardware description language code where the first net sensitivity range is split into at least two net sensitivity ranges at a location determined from a starting index of the second net sensitivity range and where the net sensitivity ranges resulting from the split do not partially overlap the second net sensitivity range;
      wherein each net sensitivity range defines a subset of signals of the net that a process of the circuit design depends upon;
      constructing, using the processor, a net sensitivity tree comprising hierarchically ordered nodes;
      wherein each node specifies a net sensitivity range of the net subsequent to the translation;
      generating, using the processor, a transaction function for the net of the circuit design as part of the simulation executable, wherein the transaction function is configured to implement a search process defined by the net sensitivity tree; and
   during execution of the simulation executable, scheduling execute functions of the simulation executable by determining whether to resume execute functions comprising procedural logic of the circuit design that are dependent upon a changed value of at least one signal of the net according to the search process by execution of the transaction function using the processor.

2. The method of claim 1, wherein each node of the net sensitivity tree is associated with an execute function of the simulation executable comprising procedural logic that is dependent upon a signal within the net sensitivity range specified by the node.

3. The method of claim 1, wherein partially overlapping net sensitivity ranges comprise the first net sensitivity range, specified in hardware description language code, having a starting index below a starting index of the second net sensitivity range specified in the hardware description language code and an ending index of the first net sensitivity range being greater than or equal to the starting index and less than the ending index of the second net sensitivity range.

4. The method of claim 1, wherein the net sensitivity ranges resulting from the split are disjoint from one another.

5. The method of claim 4, wherein at least one of the net sensitivity ranges resulting from the split is completely overlapped by the second net sensitivity range.

6. The method of claim 1, wherein translating comprises:
organizing a plurality of net sensitivity ranges comprising the first and second net sensitivity ranges into groups according to a starting index of each net sensitivity range.

7. The method of claim 6, wherein translating further comprises:
designating a group of the plurality of net sensitivity ranges as a pre-group and designating another group of the plurality of net sensitivity ranges as a current-group; and
splitting a net sensitivity range of the pre-group that has an ending index that is greater than or equal to a starting index and less than an ending index of a net sensitivity range of the current-group.

8. A non-transitory computer-readable medium having instructions which, when executed by a processor, perform operations comprising:
generating, from a circuit design, a simulation executable, wherein generating the simulation executable comprises:
translating, using the processor, hardware description language code comprising a first net sensitivity range of a net that partially overlaps a second net sensitivity range of the net into hardware description language code where the first net sensitivity range is split into at least two net sensitivity ranges at a location determined from a starting index of the second net sensitivity range and where the net sensitivity ranges resulting from the split do not partially overlap the second net sensitivity range;
wherein each net sensitivity range defines a subset of signals of the net that a process of the circuit design depends upon;
constructing a net sensitivity tree comprising hierarchically ordered nodes;
wherein each node specifies a net sensitivity range of the net subsequent to the translation;
generating a transaction function for the net of the circuit design as part of the simulation executable, wherein the transaction function is configured to implement a search process defined by the net sensitivity tree; and
during execution of the simulation executable, scheduling execute functions of the simulation executable by determining whether to resume execute functions comprising procedural logic of the circuit design that are dependent upon a changed value of at least one signal of the net according to the search process by execution of the transaction function.

9. The non-transitory computer-readable medium of claim 8, wherein each node of the net sensitivity tree is associated with an execute function of the simulation executable comprising procedural logic that is dependent upon a signal within the net sensitivity range specified by the node.

10. The non-transitory computer-readable medium of claim 8, wherein partially overlapping net sensitivity ranges comprise the first net sensitivity range, specified in the hardware description language code, having a starting index below a starting index of the second net sensitivity range, specified in the hardware description language code, and an ending index of the first net sensitivity range being greater than or equal to the starting index and less than the ending index of the second net sensitivity range.

11. The non-transitory computer-readable medium of claim 8, wherein the net sensitivity ranges resulting from the split are disjoint from one another.

12. The non-transitory computer-readable medium of claim 11, wherein at least one of the net sensitivity ranges resulting from the split is completely overlapped by the second net sensitivity range.

13. The non-transitory computer-readable medium of claim 8, wherein translating comprises:
organizing a plurality of net sensitivity ranges comprising the first and second net sensitivity ranges into groups according to a starting index of each net sensitivity range.

14. The non-transitory computer-readable medium of claim 13, wherein translating further comprises:
designating a group of the plurality of net sensitivity ranges as a pre-group and designating another group of the plurality of net sensitivity ranges as a current-group; and
splitting a net sensitivity range of the pre-group that has an ending index that is greater than or equal to a starting index and less than an ending index of a net sensitivity range of the current-group.

15. A system for hardware description language simulation of a circuit design, comprising:
a processor programmed to initiate executable operations, comprising:
generating, from the circuit design, a simulation executable, wherein generating the simulation executable comprises:
translating, using the processor, hardware description language code comprising a first net sensitivity range of a net that partially overlaps a second net sensitivity range of the net into hardware description language code where the first net sensitivity range is split into at least two net sensitivity ranges at a location determined from a starting index of the second net sensitivity range and where the net sensitivity ranges resulting from the split do not partially overlap the second net sensitivity range;
wherein each net sensitivity range defines a subset of signals of the net that a process of the circuit design depends upon;
constructing a net sensitivity tree comprising hierarchically ordered nodes;
wherein each node specifies a net sensitivity range of the net subsequent to the translation;
generating a transaction function for the net of the circuit design as part of the simulation executable, wherein the transaction function is configured to implement a search process defined by the net sensitivity tree; and
during execution of the simulation executable, scheduling execute functions of the simulation executable by determining whether to resume execute functions comprising procedural logic of the circuit design that are dependent upon a changed value of at least one signal of the net according to the search process execution of the transaction function.

16. The system of claim 15, wherein partially overlapping net sensitivity ranges comprise the first net sensitivity range, specified in hardware description language code, having a starting index below a starting index of the second net sensitivity range specified in the hardware description language code and an ending index of the first net sensitivity range being greater than or equal to the starting index and less than the ending index of the second net sensitivity range.

* * * * *